US012638477B2

(12) United States Patent
Jeong et al.

(10) Patent No.: US 12,638,477 B2
(45) Date of Patent: May 26, 2026

(54) HIGH CURRENT MEASURING DEVICE

(71) Applicant: ROOTECH INC., Suwon-si (KR)

(72) Inventors: Changyong Jeong, Suwon-si (KR);
Sungwoon Jo, Seoul (KR); **Youngbok
Byun, Yongin-si (KR); Googchun Cho**,
Gunpo-si (KR); Seongbong Choi,
Suwon-si (KR)

(73) Assignee: ROOTECH INC., Suwon-si (KR)

( * ) Notice: Subject to any disclaimer, the term of this
patent is extended or adjusted under 35
U.S.C. 154(b) by 221 days.

(21) Appl. No.: 18/573,982

(22) PCT Filed: Sep. 1, 2021

(86) PCT No.: PCT/KR2021/011720
§ 371 (c)(1),
(2) Date: Dec. 22, 2023

(87) PCT Pub. No.: WO2023/277242
PCT Pub. Date: Jan. 5, 2023

(65) Prior Publication Data
US 2024/0361359 A1 Oct. 31, 2024

(30) Foreign Application Priority Data
Jun. 28, 2021 (KR) ........................ 10-2021-0083570

(51) Int. Cl.
*G01R 15/20* (2006.01)
*G01R 15/18* (2006.01)
(Continued)

(52) U.S. Cl.
CPC ........... *G01R 15/202* (2013.01); *G01R 15/18*
(2013.01); *G01R 19/0092* (2013.01); *G01R*
*35/005* (2013.01)

(58) Field of Classification Search
CPC .. G01R 15/202; G01R 15/18; G01R 19/0092;
G01R 35/005; G01R 35/00
See application file for complete search history.

(56) References Cited

U.S. PATENT DOCUMENTS 5,451,865 A 9/1995 Coburn
9,746,500 B2 * 8/2017 Juds ..................... G01R 15/207
(Continued)

FOREIGN PATENT DOCUMENTS

JP 6270323 B2 1/2018
JP 6627989 B2 1/2020
(Continued)

*Primary Examiner* — Dominic E Hawkins
(74) *Attorney, Agent, or Firm* — Rabin & Berdo, P.C.

(57) ABSTRACT
Proposed is a high current measuring device for measuring
an entire current flowing through a metal bar (10), wherein
the metal bar (10) is a rectangle, has a plate-shaped outline,
and includes an even number of split slits (11*a*, 11*b*)
disposed in a widthwise direction at a center of a longitu-
dinal direction so that a branch set 11, which includes
branches (in an odd number no smaller than 3) through
which the entire current is divided and flows, is provided, a
1-1 notch (12*a*) and a 1-2 notch (12*b*) respectively provided
by being concaved inward from two longer sides of the
rectangle at the front ends of the split slits (11*a*, 11*b*), and a
2-1 notch (14*a*) and a 2-2 notch (14*b*) respectively provided
by being concaved inward from two longer sides of the
rectangle at the rear ends of the split slits (11*a*, 11*b*).

11 Claims, 16 Drawing Sheets

(51) Int. Cl.
    *G01R 19/00*         (2006.01)
    *G01R 35/00*         (2006.01)

(56)           References Cited

U.S. PATENT DOCUMENTS

| | | | | |
|---|---|---|---|---|
| 2013/0265041 A1 * | 10/2013 | Friedrich | ............. | G01R 15/207 |
| | | | | 324/260 |
| 2019/0178917 A1 * | 6/2019 | Shimizu | ............. | G01R 19/0092 |
| 2020/0011902 A1 * | 1/2020 | Shimizu | ............. | G01R 19/0092 |
| 2023/0071087 A1 * | 3/2023 | Vuillermet | ........... | G01R 15/207 |

FOREIGN PATENT DOCUMENTS

| | | | | | |
|---|---|---|---|---|---|
| JP | 2020067305 A | | 4/2020 | | |
| JP | 2020148733 A | * | 1/2021 | ............. | G01R 15/00 |
| JP | 2021001832 A | * | 1/2021 | ............. | G01R 15/00 |
| WO | WO-2020262065 A1 | * | 12/2020 | ............. | G01R 15/00 |

* cited by examiner

HIGH CURRENT MEASURING DEVICE

TECHNICAL FIELD

The present disclosure relates to a high current measuring device.

BACKGROUND ART

There are high AC or DC current measuring methods, such as a method using shunt resistance, a method employing a core and winding, and a method utilizing a core and a Hall effect sensor.

The method of using a shunt resistor involves inserting a resistor into a conductor through which AC/DC current flows and measuring the voltage at the resistor, resulting in loss and insulation problems. In addition, a conventional method of employing a core and winding needs to be configured to surround a conductor (or conductor and coating) with a large cross-section, so there is a disadvantage in increasing the size of the core and increasing the number of windings. In addition, a conventional method utilizing a core and a Hall effect sensor may measure AC/DC simultaneously but needs to be constituted in a shape that surrounds a conductor with a large cross-section. Therefore, an increase in the size of the core not only requires a proportional increase in the size of the gap, into which the Hall effect sensor is inserted, but also poses a challenge in securing precision.

DISCLOSURE

Technical Problem

Accordingly, the present disclosure has been made keeping in mind the above problems occurring in the related art, and an objective of the present disclosure is to provide a high current measuring device capable of measuring a high current in a relatively smaller size.

In addition, another objective of the present disclosure is to provide the high current measuring device capable of measuring high currents without employing a method for sensing an entire current.

Technical Solution

In order to accomplish the above objective, one aspect of the present disclosure may provide a high current measuring device for measuring an entire current flowing through a metal bar 10, using the metal bar 10 and a current sensor module 20 coupled thereto.

The metal bar 10 may include: a branch set 11 in which a plurality of branches, through which the entire current is divided and flows, is disposed adjacent to each other, wherein the current sensor module 20 is mounted on a center branch 11c in a center among the plurality of branches included in the branch set 11, and the entire current is calculated from a partial current sensed by the current sensor module 20.

In the current measuring device, the branch set 11 may include: the center branch 11c; a first side branch 11s-1 located adjacent to one side of the center branch 11c and having a gap width s1 spaced apart from the center branch 11c; and a second side branch 11s-2 located adjacent to an opposite side of the center branch 11c and having a gap width s2 spaced apart from the center branch 11c, wherein a width w2 of the first side branch 11s-1 and a width w3 of the second side branch 11s-2 are the same.

In the current measuring device, the center branch 11c, the first side branch 11s-1, and the second side branch 11s-2 may all have the same thickness t and be located on the same plane.

In the current measuring device, the metal bar 10 may include: bottleneck parts 12 and 14, which are each constituted between one of connecting points with the outsides and the branch set 11 and through which the entire current flows.

In the current measuring device, the metal bar 10 may include: a first connecting part 13 constituted at one end of the metal bar 10 for a connection to the outside; a first bottleneck part 12, which is constituted between the first connecting part 13 and the branch set 11 and through which the entire current flows in a concentrated manner before being distributed to the plurality of branches; a second connecting part 15 constituted at an opposite end of the metal bar 10 for a connection to the outside; and a second bottleneck part 14, which is constituted between the branch set 11 and the second connecting part 15 and through which the entire current, which has been distributed to flow through the plurality of branches, flows in a concentrated manner.

In the current measuring device, the first bottleneck part 12, the center branch 11c, and the second bottleneck part 14 may be disposed on a straight line along a longitudinal direction and located at a center in a widthwise direction, of the metal bar 10.

In the current measuring device, the branch set 11, the first connecting part 13, the first bottleneck part 12, the second connecting part 15, and the second bottleneck part 14 may all have the same thickness t and be located on the same plane.

In the current measuring device, a width of each of the first bottleneck part 12 and the second bottleneck part 14 may be no greater than ½ of a width that sums widths w1, w2, and w3 of all branches included in the branch set 11.

One aspect of the present disclosure may provide a high current measuring device for measuring an entire current flowing through a metal bar 10, using the metal bar 10 and a current sensor module 20 coupled thereto, wherein the metal bar 10 may be a rectangle, have a plate-shaped outline, and include: an even number of split slits 11a, and 11b disposed in a widthwise direction so that a branch set 11 including branches provided in odd numbers of no smaller than 3, through which the entire current is divided and flows, is provided in a center of a longitudinal direction; a 1-1 notch 12a and a 1-2 notch 12b provided at front ends of the split slits 11a and 11b, respectively; and a 2-1 notch 14a and a 2-2 notch 14b provided at rear ends of the split slits 11a and 11b, respectively.

In the current measuring device, lengths n1, n2, n3, and n4 of the 1-1 notch 12a, the 1-2 notch 12b, the 2-1 notch 14a, and the 2-2 notch 14b, which are each concaved inward from a corresponding longer side of the rectangle, may all be the same.

In the current measuring device, an even number of split slits 11a and 11b may be symmetrical with respect to both the longitudinal and widthwise directions, the current sensor module 20 may be mounted on a center branch 11c located in a center among the branches included in the branch set 11, and the entire current may be calculated from a partial current sensed by the current sensor module 20.

In the current measuring device, one end of the metal bar 10 may be provided with a first fastening hole 13a and 13b for fastening a bolt when connected to the outside, and an opposite end of the metal bar 10 is provided with a second fastening hole 15a and 15b for fastening a bolt when connected to the outside.

In the current measuring device, the current sensor module may include a Current Transformer CT or a Hall sensor having a core surrounding the center branch 11c.

In the current measuring device, the current measuring device may further include: a calibration unit that is provided with a calibration table configured to store a one-to-one correspondence between the partial current and the entire current and is configured to calculate the entire current from the partial current sensed by the current sensor module 20 using the calibration table, wherein the calibration table is calibrated in the process of the production of each current measuring device.

Advantageous Effects

As described above, according to one aspect of the present disclosure, the current sensor only needs to measure the size that penetrates a center branch, so high currents can be measured with a relatively smaller size, and there is an effect in that a high current can be measured without employing a method of sensing an entire current.

According to one aspect of the present disclosure, a bottleneck part, which is constituted between a connecting point with the outside and a branch set and through which an entire current flows in a concentrated manner, is provided in a metal bar, whereby there is an effect in that an equal ratio of current can be ensured to always flow in the center branch regardless of the location of the connecting point (connecting spot).

According to one aspect of the present disclosure, in the metal bar of the current measuring device, the bottleneck parts and the center branch are disposed on a straight line along a longitudinal direction and located at a center in a widthwise direction. As a result, a constant ratio of the currents flows through the center branch regardless of the connecting point (connecting spot) with the outside. Accordingly, this has an effect of enabling measurement with higher precision.

DESCRIPTION OF DRAWINGS

FIG. 16A and FIG. 16B are graphs each differently showing results of measuring current while varying the connecting points (connecting spots) with the outside using the prototype of FIG. 15, wherein FIG. 16A is a graph shown on a linear scale and FIG. 16B is a graph shown on a logarithmic scale.

BEST MODE

Figure 1:
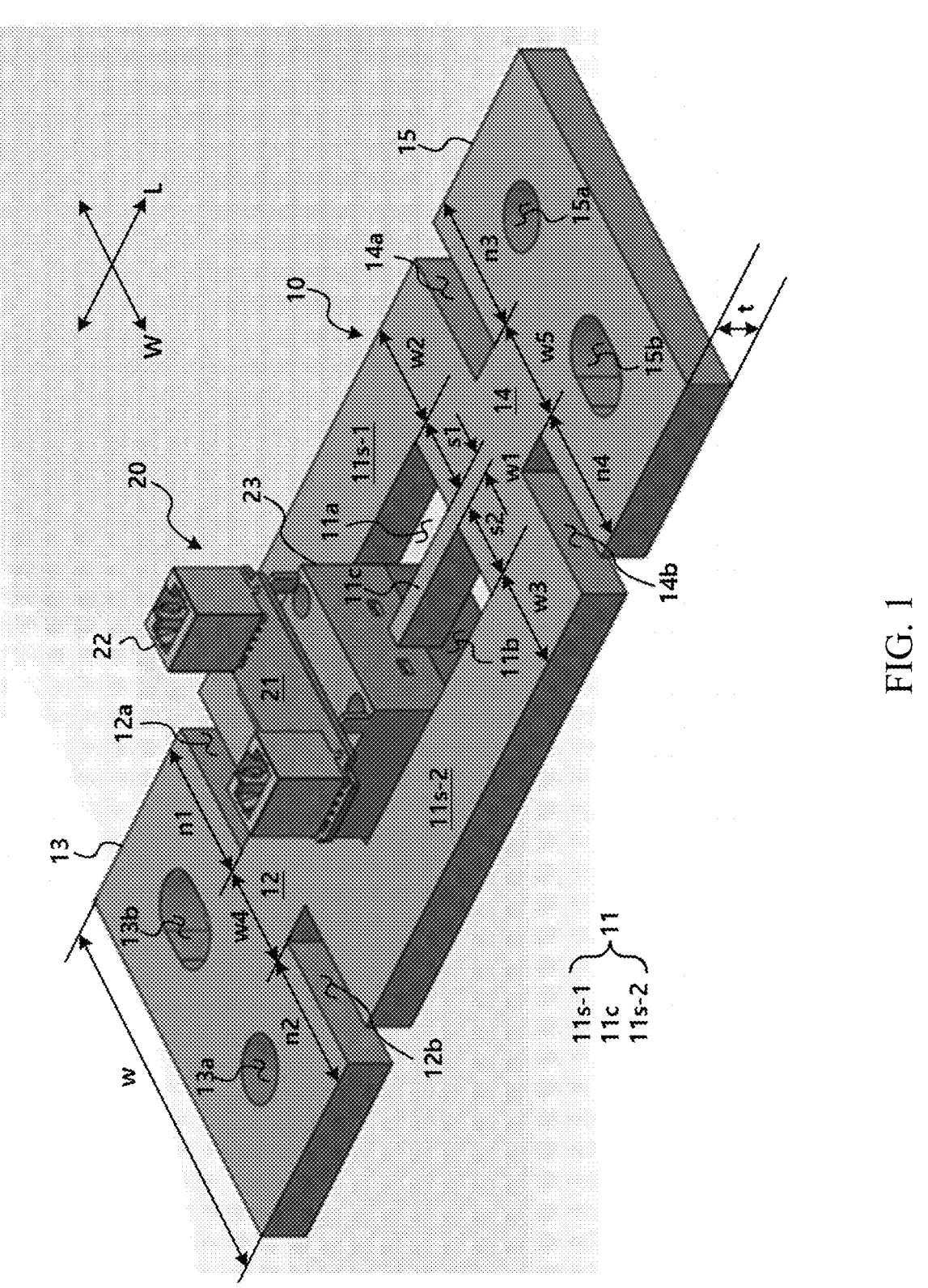
FIG. 1 is a view showing a current measuring device according to an embodiment of the present disclosure.

FIG. 1 is a view showing a current measuring device according to an embodiment of the present disclosure.

The current measuring device according to an embodiment of the present disclosure includes a metal bar 10 and a current sensor module 20 coupled thereto and is configured to measure an entire current flowing through the metal bar 10 using the metal bar 10 and the current sensor module 20.

The metal bar 10 constitutes a path of power that is supplied and is also a component of the current measuring device of the present disclosure. In addition, for example, the metal bar 10 may be an existing bus bar, a substitute that replaces a crossbar, or a substitute that replaces an existing metal part required in the power path of a distribution board or switchboard.

An outline of the metal bar 10 is a rectangle and a plate shape and has a regular thickness 't' depending on an entire current capacity. The metal bar 10 is the rectangle and has empty spaces such as split slits 11a, 11b, notches 12a, 12b, 14a, and 14b, and fastening holes 13a, 13b, 15a, and 15b within plate-shaped metal. Both a main surface on one side and a main surface on an opposite side of the metal bar 10 may be flat. The metal bar 10 may be manufactured using a mold or by processing a rectangular, plate-shaped metal bar through cutting and similar methods.

In a center of the metal bar 10 in a longitudinal direction L, an even number, for example, two, split slits 11a and 11b may be disposed in a widthwise direction W. The two split slits 11a and 11b are disposed on opposite sides of a center branch 11c. The two (the even number of) split slits 11a and 11b are symmetrical in the widthwise direction W about the center branch 11c and are also symmetrical in the longitudinal direction L of the metal bar 10.

The entire current flowing through the metal bar 10 flows by being divided by branches (provided in odd numbers of no smaller than 3, which may be 3), and the metal bar 10 constitutes a branch set 11 including a center branch 11c, a first side branch 11s-1, and a second side branch 11s-2. The branch set 11 is configured in such a way that a plurality of branches, through which the entire current is divided to flow, is arranged adjacent to each other.

The center branch 11c is located at the center among the plurality of branches included in the branch set 11, and the current sensor module 20 is mounted on the center branch 11c. The current sensor module 20 calculates the entire current flowing in the metal bar 10 from the partial current flowing in the center branch 11c. At this time, the correspondence between the partial current and the entire current has been predefined, whereby the entire current may be obtained from the partial current.

The current sensor module 20 may be configured to include a wound-type Current Transformer (CT) inside its case 23 or a core that surrounds the center branch 11c and a Hall sensor. At this time, in the case of the Hall sensor type, the Hall sensor is located in a disconnected gap of the core. In addition, the current sensor module 20 may be provided with a communication port 22 for transmitting the sensed current or measured current, and a PCB board 21 for mounting the communication port 22. In addition, other types of current sensors known in the technical field of the present application may be employed as the current sensor module 20.

The side branches 11s-1 and 11s-2 respectively have gap widths s1 and s2 spaced apart from the center branch 11c by the split slits 11a and 11b and are located adjacent to opposite sides of the center branch 11c. The first side branch 11s-1 has the gap width s1 spaced apart from the center branch 11c by the first split slit 11a and is located adjacent to one side of the center branch 11c. The second side branch 11s-2 has the gap width s2 spaced apart from the center branch 11c by the second split slit 11b and is located adjacent to an opposite side that is an opposite side surface to one side surface of the center branch 11c.

Among the branches included in the branch set 11, the current sensor module 20 is mounted on the center branch 11c located in the center, and the two split slits 11a and 11b around the center branch 11c provide spaces where the current sensor module 20 may be mounted. Specifically, the current sensor module 20 may have a core through which the sensor branch 11c passes, the two split slits 11a and 11b provide the spaces where such a core may be located.

The center branch 11c, the first side branch 11s-1, and the second side branch 11s-2 all have the same thickness 't' and are located on the same plane. Furthermore, the entire elements constituting the metal bar 10, that is, the branch set 11, the first connecting part 13, the first bottleneck part 12, the second connecting part 15, and the second bottleneck part 14 all have the same thickness 't' and are located on the same plane.

The width w2 of the first side branch 11s-1 and the width w3 of the second side branch 11s-2 are configured to be the same, the width s1 of the first split slit and the width s2 of the second split slit are also configured to be the same, and the first side branch 11s-1 and the second side branch 11s-2 are configured symmetrically around the center branch 11c.

The thickness 't' of the branches in the branch set 11 is the same, but the width w1 of the center branch 11c may be made to be smaller than the widths w2 and w3 of the opposite side branches 11s-1 and 11s-2. That is, the partial current flowing through the center branch 11c is made to be smaller than the partial current flowing through each of the side branches 11s-1 and 11s-2, whereby the ratio of the entire current to the partial current through the center branch is increased. Accordingly, the size of the entire current that is an object to measure is increased compared to the actual sensing current through the current sensor module 20. Looking at this conversely, it is possible to measure a high overall current even while reducing the size of the core included in the current sensor module 20 that senses a small current.

The first connecting part 13 is configured to be provided on one end of the metal bar 10 so as to be connected to the outside, and the second connecting part 15 is configured to be provided on the opposite end of the same metal bar 10 so as to be connected to the outside. The first connecting part 13, which is the one end of the metal bar 10, is provided with first fastening holes 13a and 13b for fastening bolts when connected to the outside, and the second connecting part 15, which is the opposite end of metal bar 10, is provided with second fastening holes 15a and 15b for fastening bolts when connected to the outside.

In addition, the metal bar 10 is provided with bottleneck parts 12 and 14, which are each located between the connecting point with the outside and the branch set 11 and through which the entire current flows in a concentrated manner. Here, one feature of the present disclosure is to constitute the bottleneck parts 12 and 14. In the present disclosure, bottleneck parts 12 and 14 are provided between the connecting parts 13 and 15, which are the connecting points with the outside, and the branch set, respectively. In this case, the bottleneck parts 12 and 14 have a disadvantage of slightly increasing the intervening resistance by making the sectional area through which the current may flow smaller but are intended to have an advantage of improving the measurement accuracy of the current.

The first bottleneck part 12 is configured between the first connecting part 13 and the branch set 11 and allows the entire current flowing through the metal bar to flow in a concentrated manner before being distributed to the branches (naturally, the current flow in the opposite direction is also similar). The second bottleneck part 14 is configured between the branch set 11 and the second connecting part 15 and allows the entire current flowing by being distributed through the plurality of branches to flow in a concentrated manner (the current flow in the opposite direction is also similar). Therefore, the current density per unit area at each of the bottleneck parts is significantly greater than the current density per unit area at each branch.

When viewed in the longitudinal direction L, the first bottleneck part 12 and the second bottleneck part 14 are provided on the opposite sides of the branch set respectively. Naturally, for the linkage between the first bottleneck part 12 and each of the branches, a first linking part (no drawing number) is provided to link the first bottleneck part 12 and each of the branches, and for the linkage between the second bottleneck part 14 and each of the branches, a second linking part (no drawing number) is provided to link the second bottleneck part 14 and each of the branches. Meanwhile, the width of each of the first linking part and the second linking part is the same as the width 'w' of the metal bar 10.

The width of the first bottleneck part 12 may be no greater than ½ of the sum of the widths w1, w2, and w3 of all branches included in the branch set 11. Additionally, the width of the second bottleneck part 14 may be no greater than ½ of the sum of the widths w1, w2, and w3 of all branches included in the branch set 11. In addition, the current density of the current flowing through each of the bottleneck parts may be at least twice that of the current density of the current flowing through each of the branches.

In order to constitute the bottleneck parts 12 and 14 in the metal bar 10, a plurality of notches 12a, 12b, 14a, and 14b is constituted on the rectangular, plate-shaped metal bar.

At the front end of the split slits 11a and 11b, that is, at the front end of the branch set 11, a 1-1 notch 12a and a 1-2 notch 12b are respectively provided by being concaved inward from two longer sides of the rectangle, which are partial parts of an outline of the metal bar 10. In addition, at the rear end of the split slits 11a and 11b, that is, at the rear end of the branch set 11, a 2-1 notch 14a and a 2-2 notch 14b are respectively provided by being concaved inward from two longer sides of the rectangle.

A 1-1 notch 12a, a 1-2 notch 12b, a 2-1 notch 14a, and a 2-2 notch 14b respectively have a first length n1, a second length n2, a third length n3, and a fourth length n4, and each length is concaved inward from a corresponding longer side of the rectangle. In addition, the first length n1, the second length n2, the third length n3, and the fourth length n4 may be all the same.

Hereinafter, with reference to FIGS. 2 to 8, the function and effect of the bottleneck part will be described.

Figure 2:
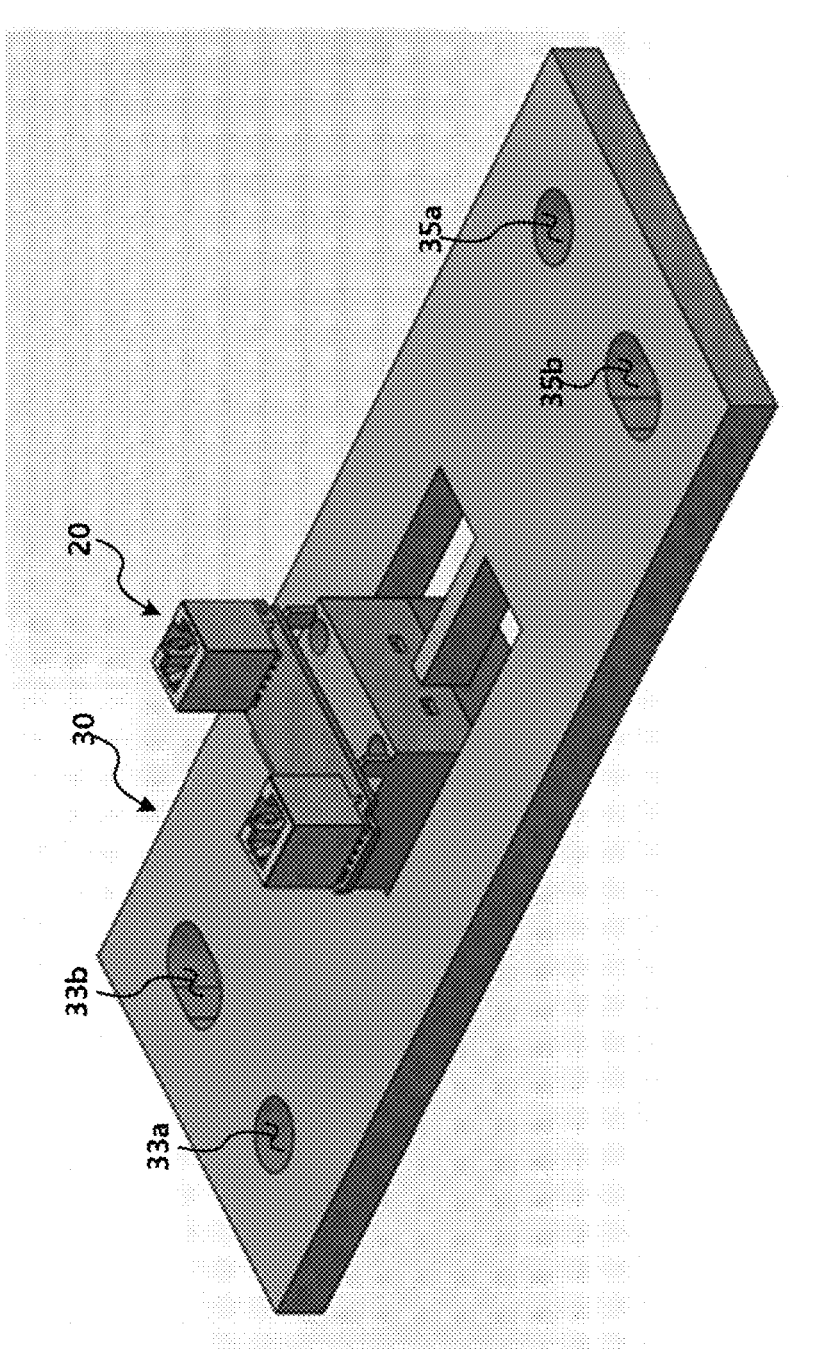
FIG. 2 is a comparative example showing an example of the current measuring device to which bottleneck parts (notches) are not applied.

FIG. 2 is a comparative example showing an example of the current measuring device to which bottleneck parts (notches) are not applied. In addition, FIGS. 3 to 5 each show results of simulations using Flux 3D, assuming several cases for a connecting region to the outside, to determine current flow characteristics of a metal bar to which the bottleneck parts (notches) are not applied.

In the current measuring device such FIG. 2, the metal bar 30 may be provided with fastening holes 33a, 33b, 35a, and 35b, and electrical connection with external components may be ensured by tightening the bolts that pass through these fastening holes. However, depending on the number of bolts used and the degree of tightening, or which fastening hole the bolt is fastened to when one of the two fastening holes, located on each of the opposite ends, is used, the locations of the main electrical connecting spots on the metal bar 30 change.

Figure 3:
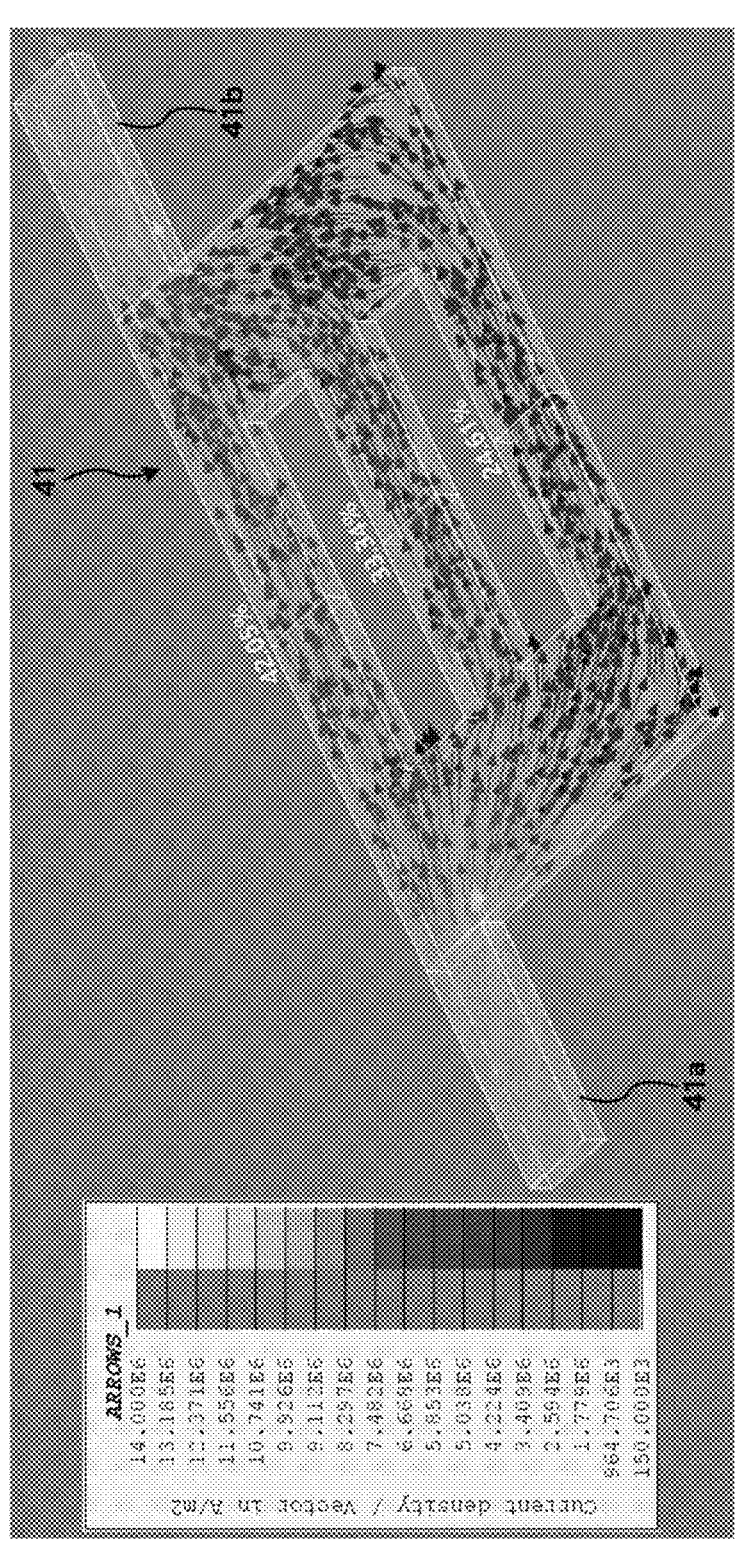
FIGS. 3 to 5 each show results of simulations using Flux 3D, assuming several cases for a connecting region to the outside, to determine current flow characteristics of a metal bar to which the bottleneck parts (notches) are not applied.
Figure 4:
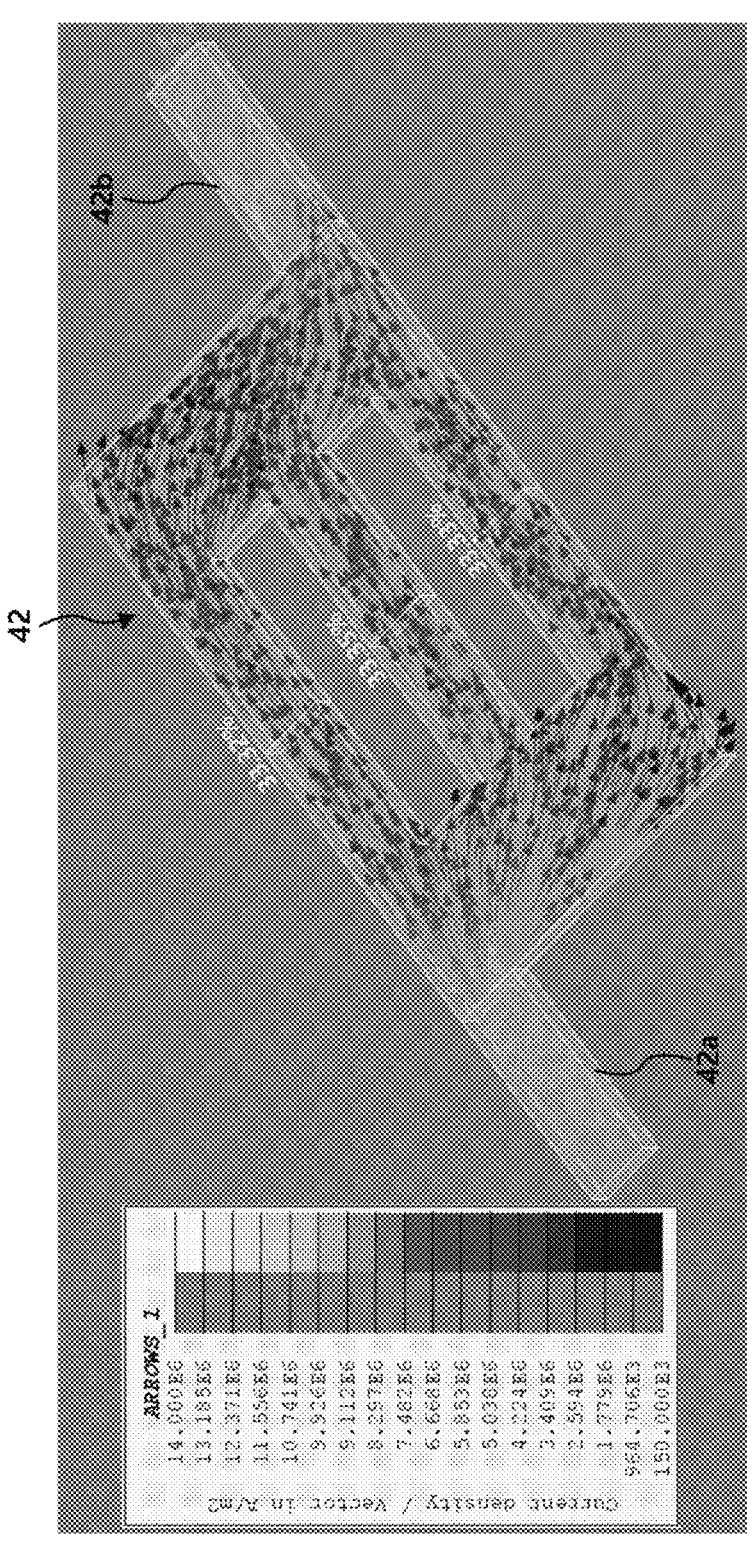
Figure 5:
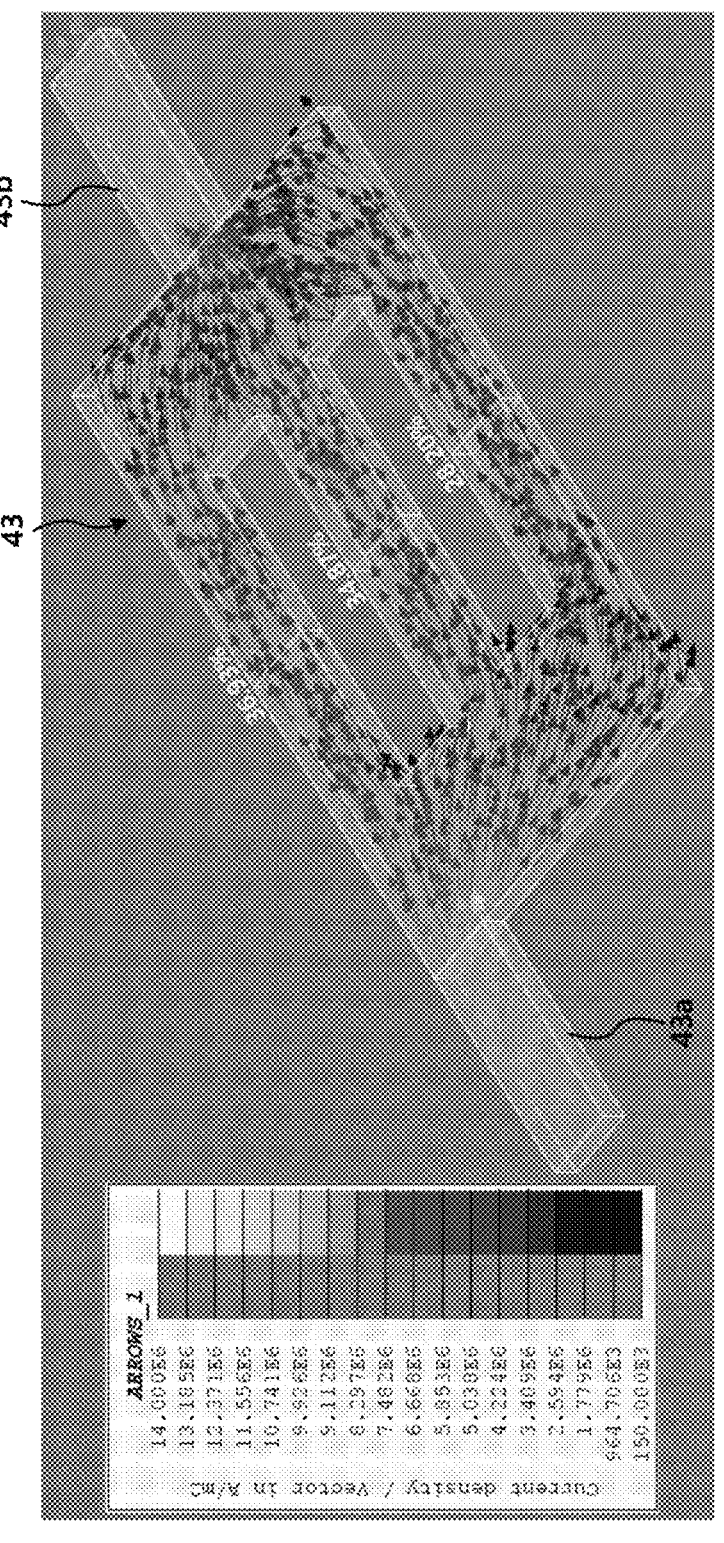

In FIGS. 3 to 5, virtual connecting parts 41a, 41b, 42a, 42b, 43a, and 43b are correspondingly constituted on the metal bars to simulate the connecting regions with the outsides at the metal bars 41, 42, and 43, thereby simulating the supply of the currents through specific areas of the metal bars.

In the simulation of FIG. 3, the connecting spots are respectively constituted on upper sides of the opposite sides of the metal bar 41, in the simulation of FIG. 4, the connecting spots are respectively constituted on an upper left side and a lower right side of the metal bar 42, and in the simulation of FIG. 5, the connecting spots are respectively constituted on an upper left side and a middle right side of the metal bar 43.

As may be seen from the simulation results, depending on the locations of the connecting spots, the currents flowing in the upper side branch show large deviations of 42.05%, 33.32%, and 36.93% compared with the entire current, and the currents flowing in the lower side branch show large deviations of 24.61%, 33.33%, and 28.20%. In contrast to this, the currents flowing in the center branch show small deviations of 33.34%, 33.35%, and 34.87%. In other words, the deviation of the currents flowing through the center branch is much smaller than that of the side branches.

In the simulation, the maximum deviation of the currents flowing through the center branch is 1.53% (calculated as 34.87–33.34), which, though a small value, remains insufficient for applications demanding a high level of precision. Even when the connecting spots with the outside differ, precision measurement is achievable only when the currents are distributed uniformly. However, the ratio of current values flowing through the center branches may vary slightly depending on the positioning of the connecting spots. Consequently, such a structure may not be suitable for high-precision current measurements, as the current values could fluctuate depending on factors such as tightening and the locations of the parts coupled with the outsides.

Figure 6:
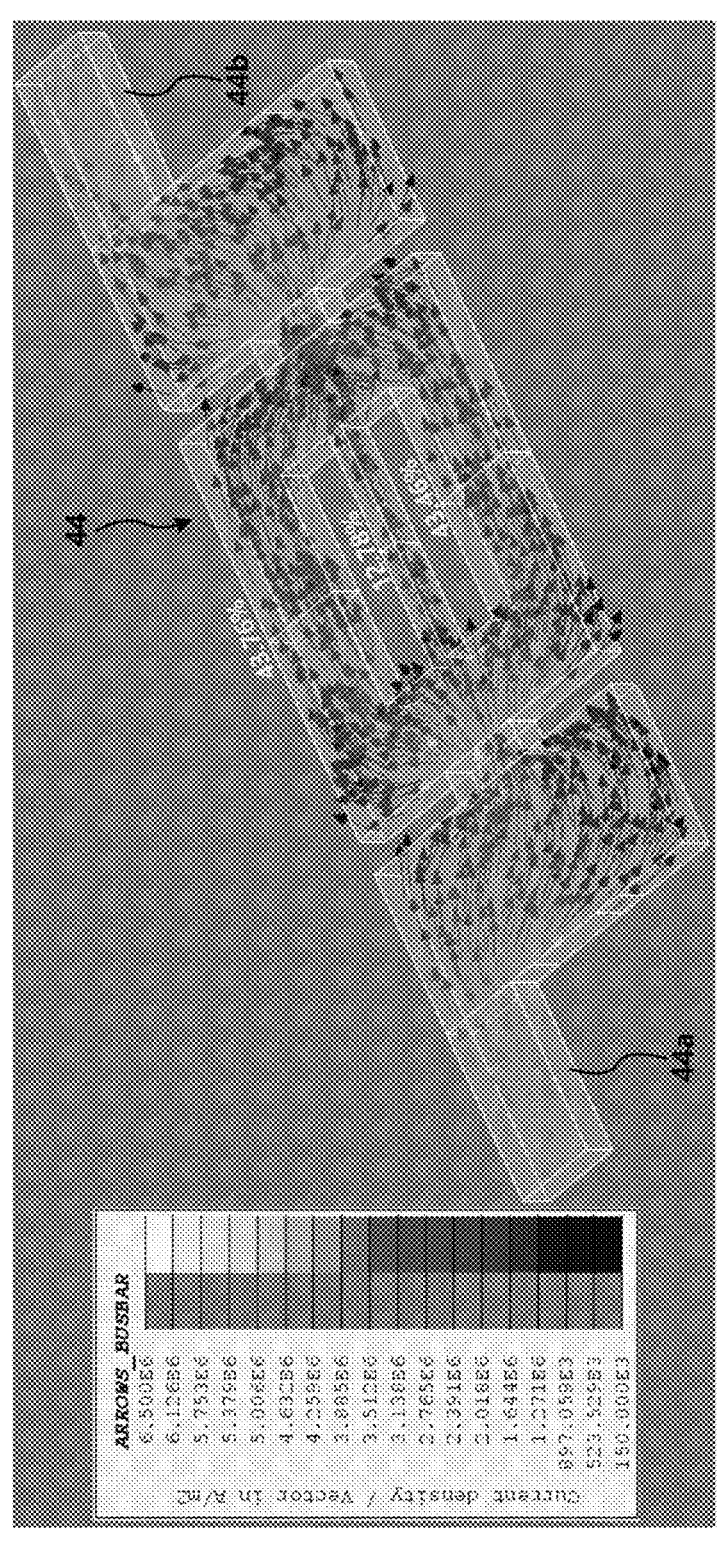
FIGS. 6 to 8 each show results of simulations, assuming several cases for a connecting region to the outside, to determine current flow characteristics of the metal bar to which the bottleneck parts (notches) are applied.
Figure 7:
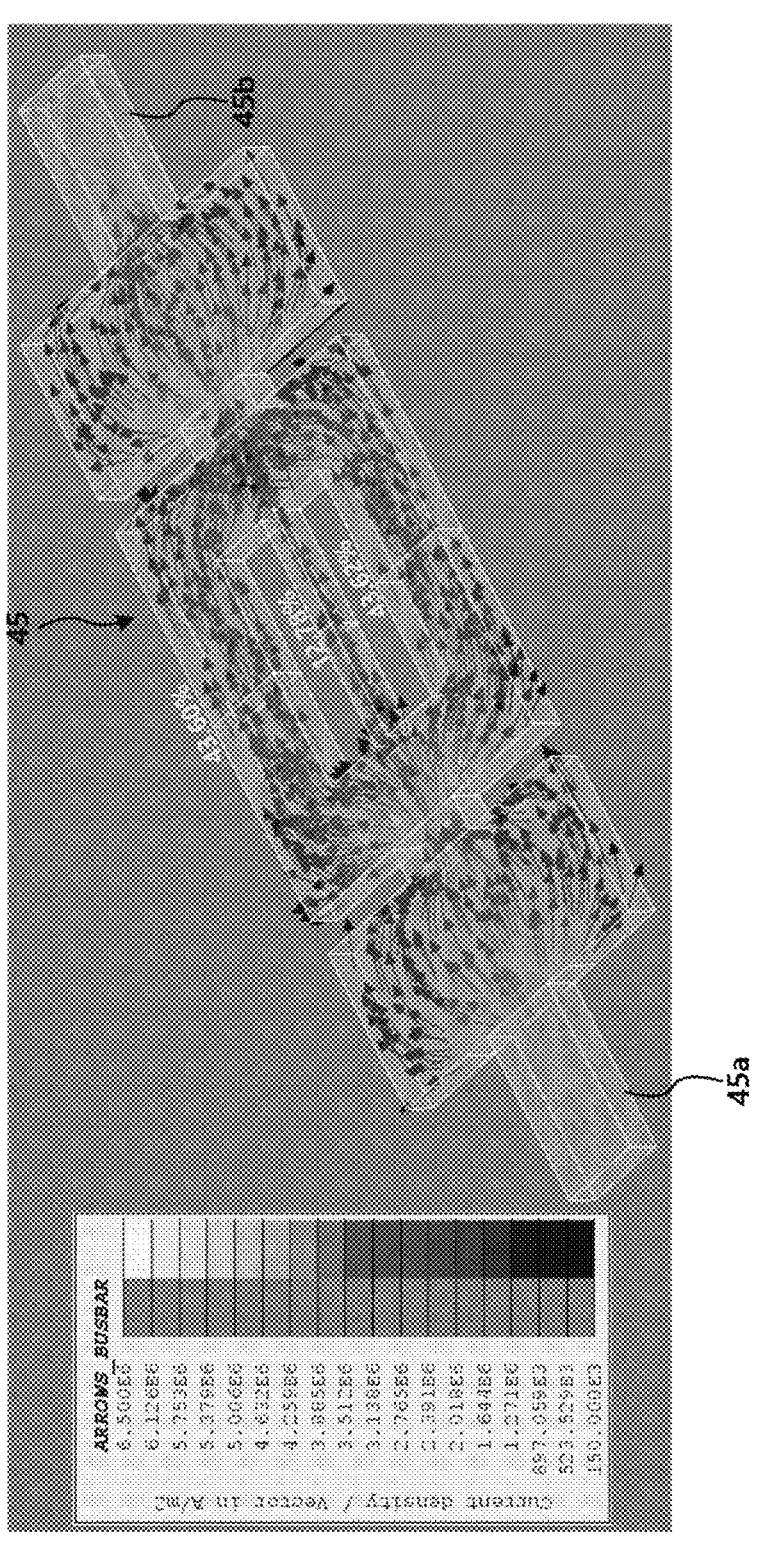
Figure 8:
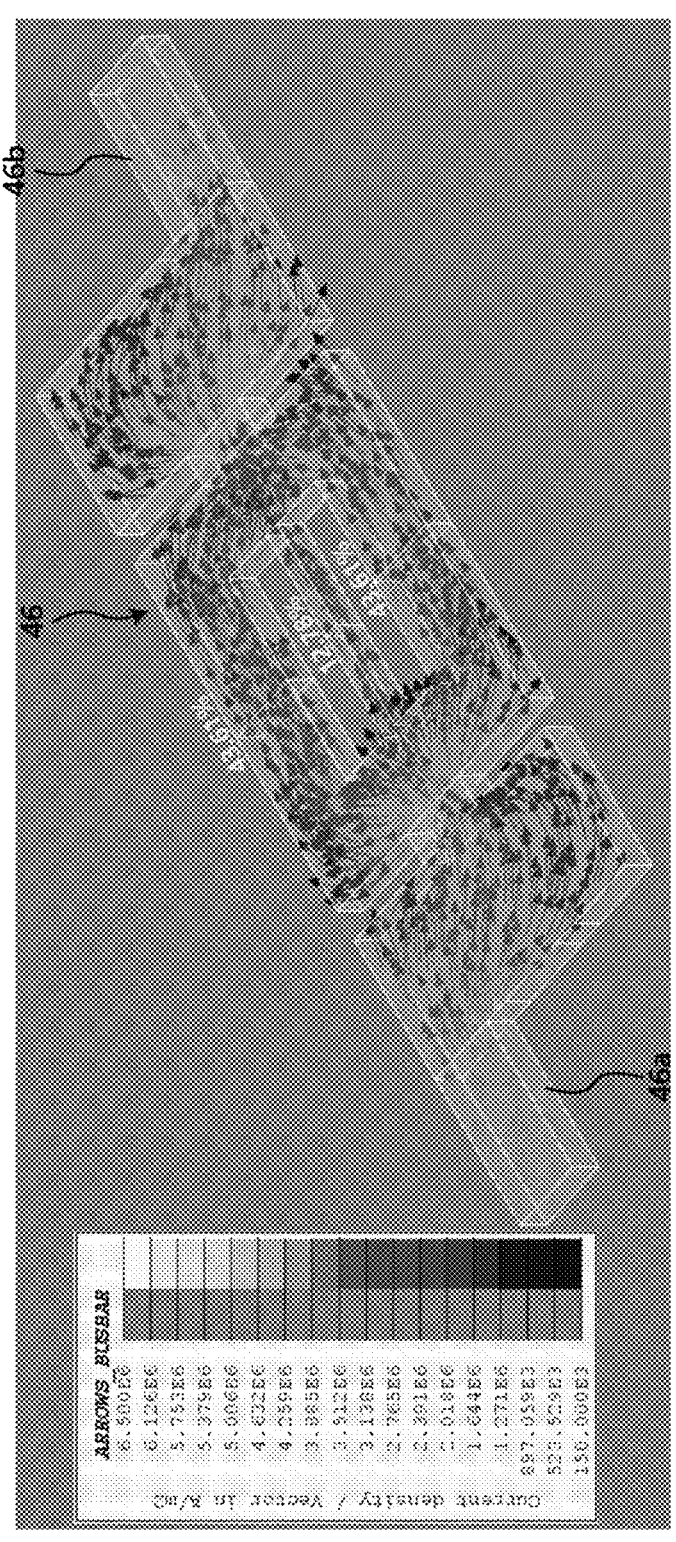

FIGS. 6 to 8 each show results of simulations, assuming several cases for a connecting region to the outside, to determine current flow characteristics of the metal bar to which the bottleneck parts (notches) are applied like the present disclosure.

In FIGS. 6 to 8, virtual connecting parts 44a, 44b, 45a, 45b, 46a, and 46b are correspondingly constituted on the metal bars to simulate the connecting regions with the outsides at the metal bars 44, 45, and 46, thereby simulating the supply of the currents through specific areas of the metal bars.

In the simulation of FIG. 6, the connecting spots are respectively constituted on upper sides of the opposite sides of the metal bar 44, in the simulation of FIG. 7, the connecting spots are respectively constituted on a left middle side and a right middle side of the metal bar 45, and in the simulation of FIG. 8, and the connecting spots are respectively constituted on an upper left side and a lower right side of the metal bar 46.

As may be seen from the simulation results, depending on the locations of the connecting spots, the currents flowing in the upper side branches have current distribution ratios of 43.76%, 43.60%, and 43.61%, and the currents flowing in the lower side branches have current distribution ratios of 43.46%, 43.62%, and 43.61%.

In particular, the currents flowing in the center branch are 12.78%, 12.78%, and 12.78% compared with the entire current and have the same current distribution ratios up to 2 decimal places as shown in the simulation.

As in the embodiment shown in FIG. 1, the metal bar of the present disclosure is provided with a bottleneck part, provided between the connecting point to the outside, on each of the opposite sides, and the branch set, and through which the entire current flows in a concentrated manner, thereby having the effect of allowing the same ratio of the current to flow always in the center branch regardless of the locations of the connecting points (connecting spots).

According to the present disclosure, it is possible to check that current flows at the same ratio in the center branch regardless of the connecting spot, and there is an effect of accurately determining an entire proportional current even by measuring only the current in the center branch.

Meanwhile, in the metal bar 10 of the current measuring device according to the embodiment of the present disclosure, a first bottleneck part 12, a center branch 11c, and a second bottleneck part 14 are disposed on a straight line along the longitudinal direction (see FIG. 1). Looking at this differently, just as the center branch among the branches is located at the center in the width direction W of the metal bar, similarly, the bottlenecks 12 and 14 are also located at the center in the width direction W.

Figure 9:
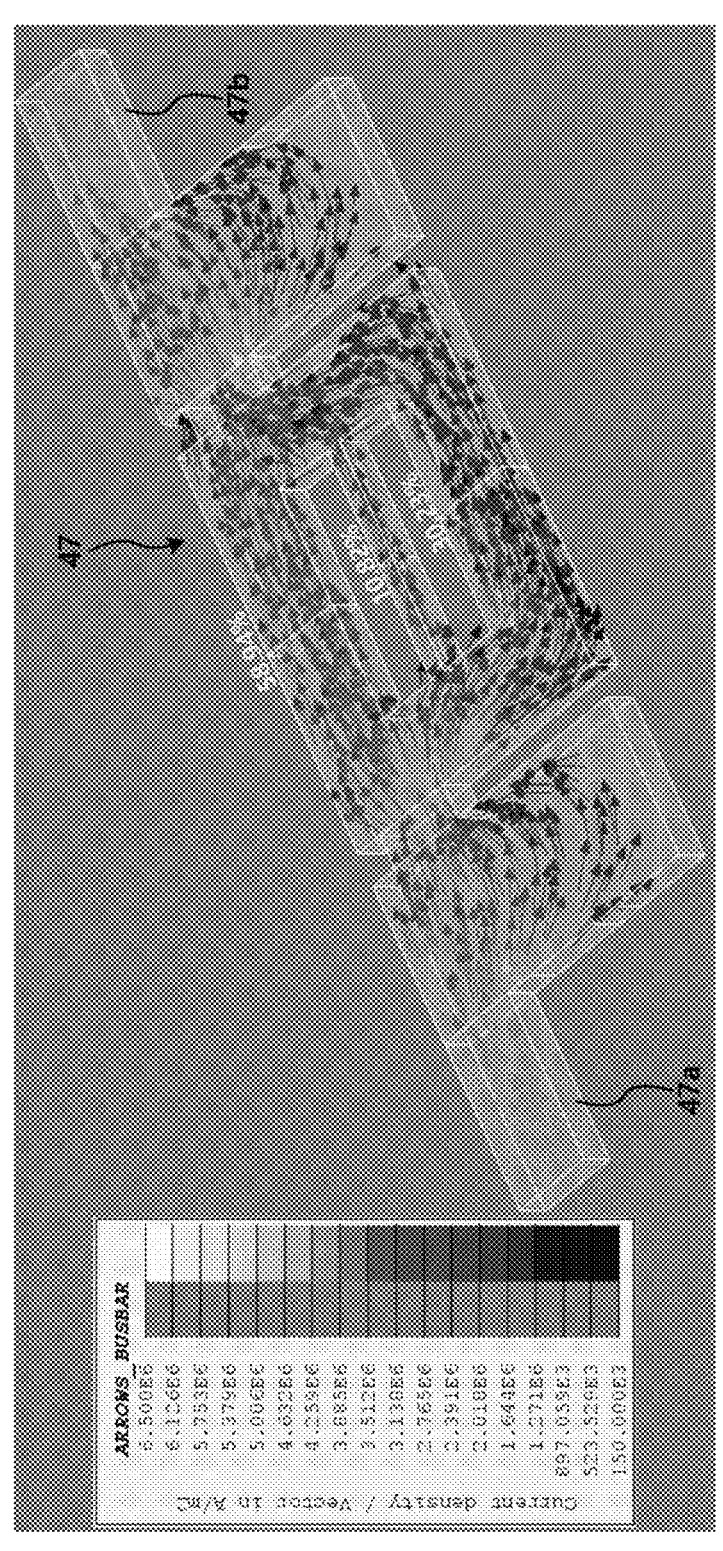
FIGS. 9 to 11 each show results of simulations for currents flowing through the metal bar, to which bottleneck parts (notches) are applied but locations of the bottleneck parts are upward rather than at a center.
Figure 10:
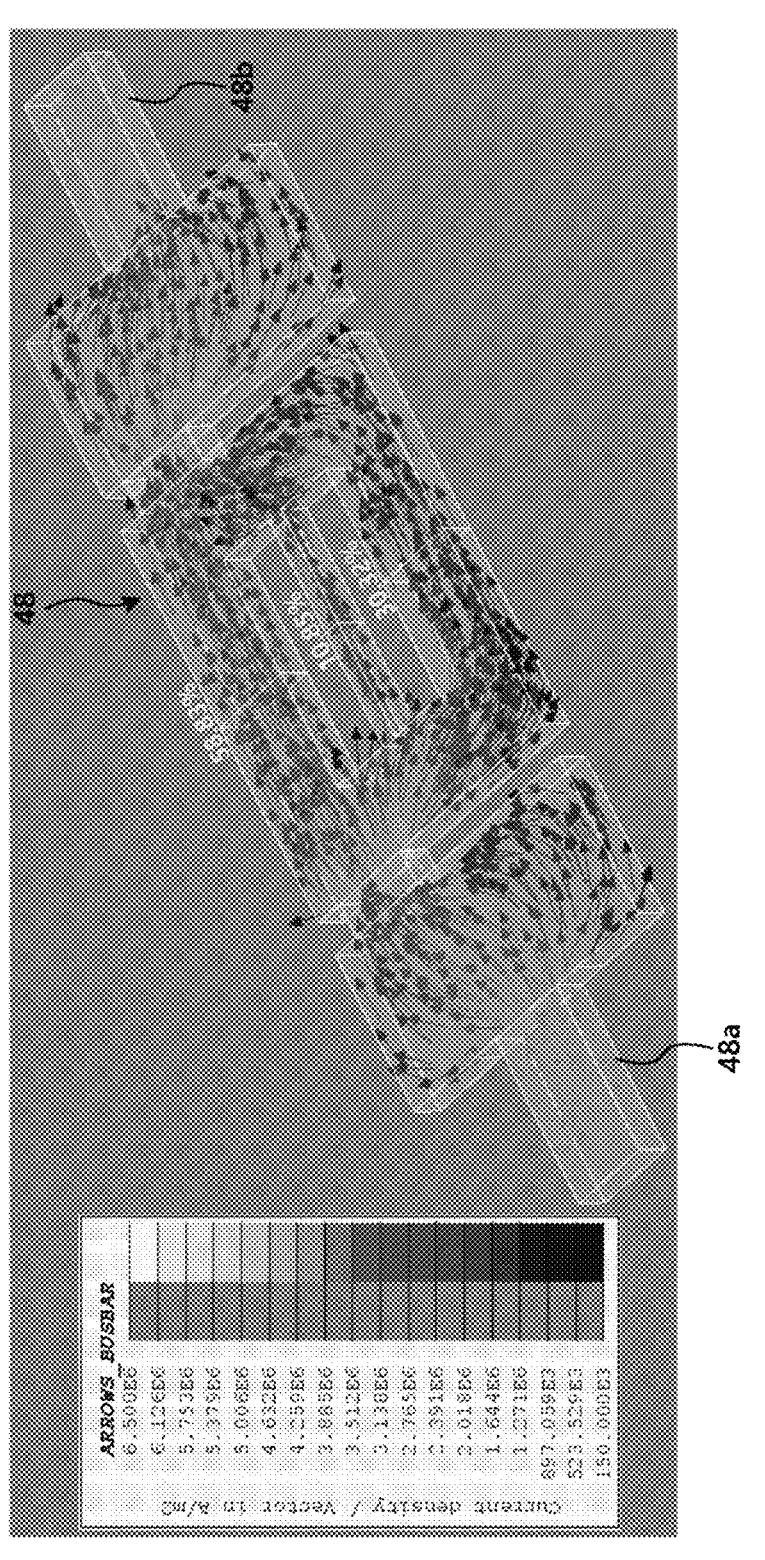
Figure 11:
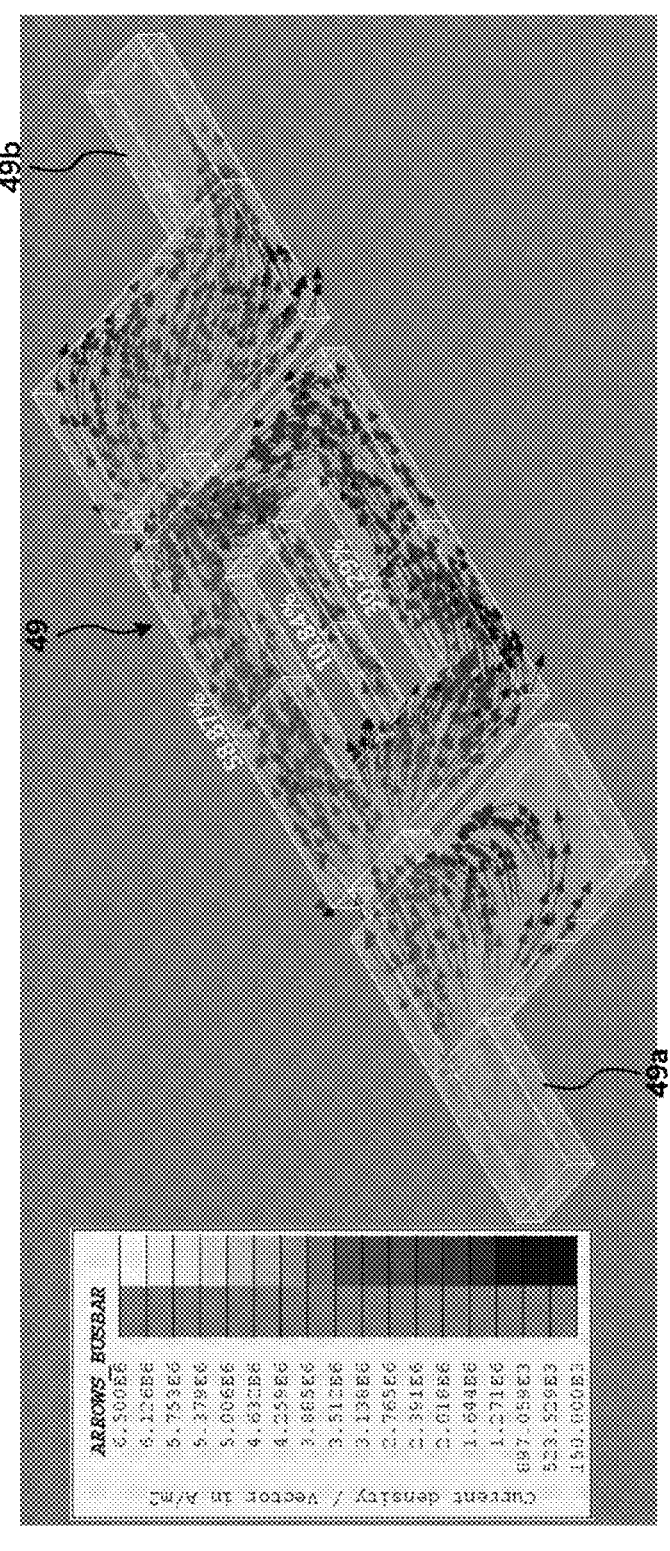
Figure 12:
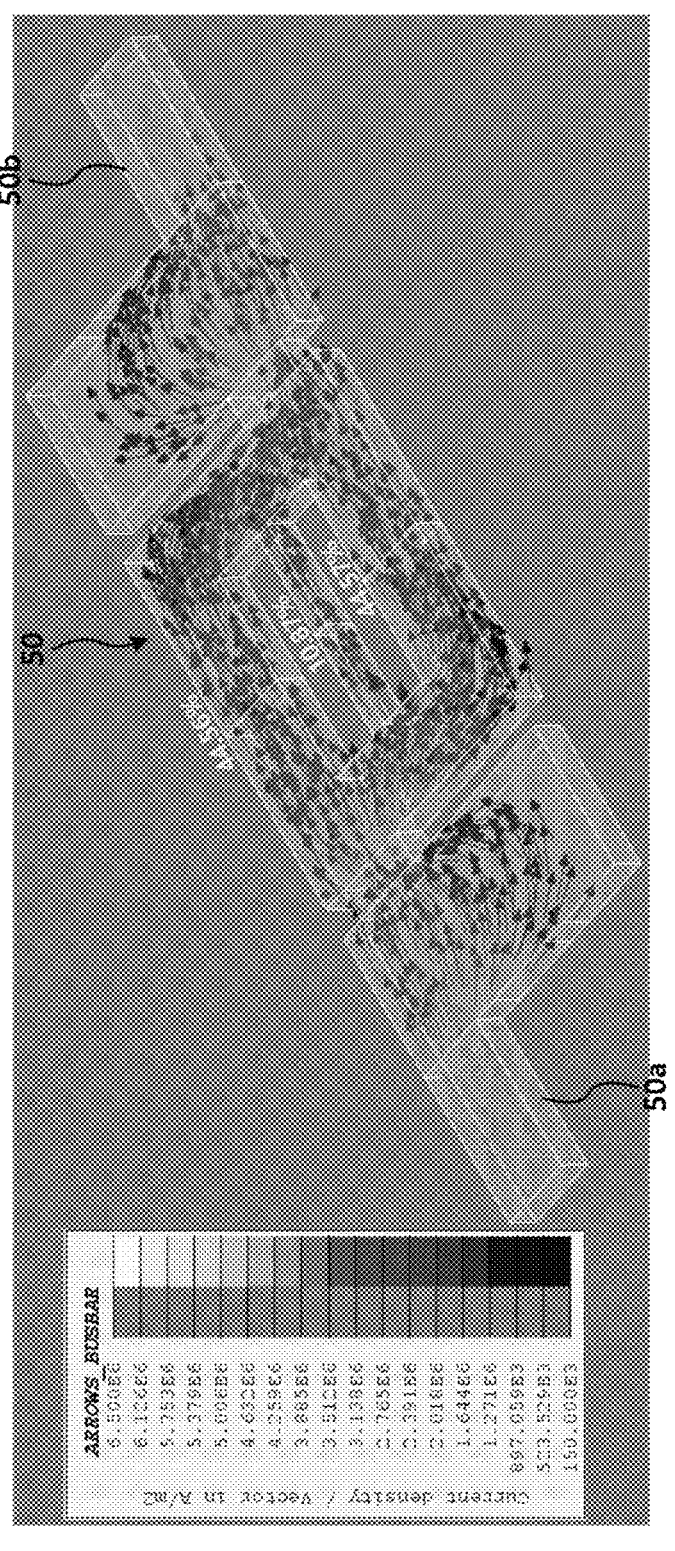
FIGS. 12 to 14 each show the results of simulations for currents flowing through the metal bar to which the bottleneck parts (notches) are applied, wherein a first bottleneck part is at an upper side, and a second bottleneck part is at a lower side.
Figure 13:
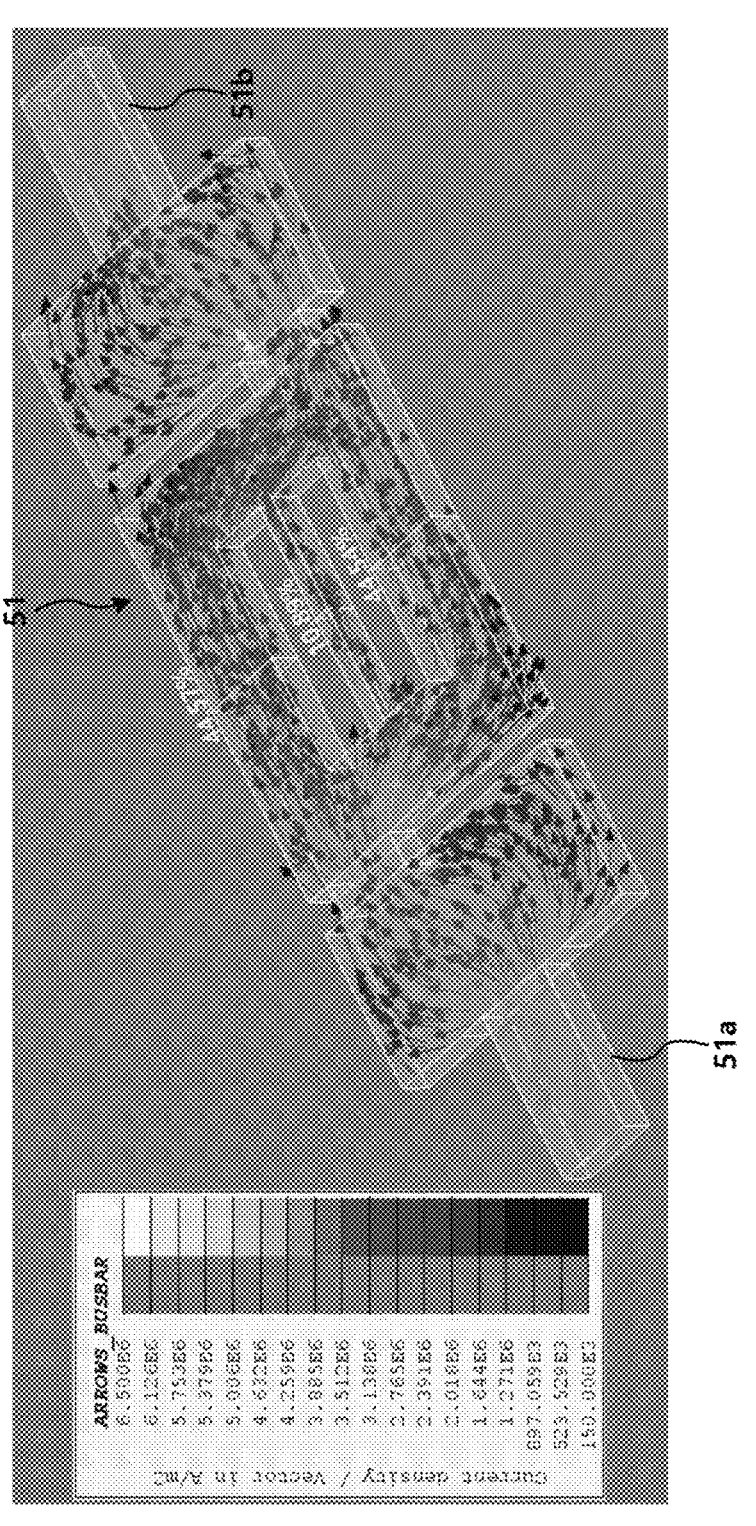
Figure 14:
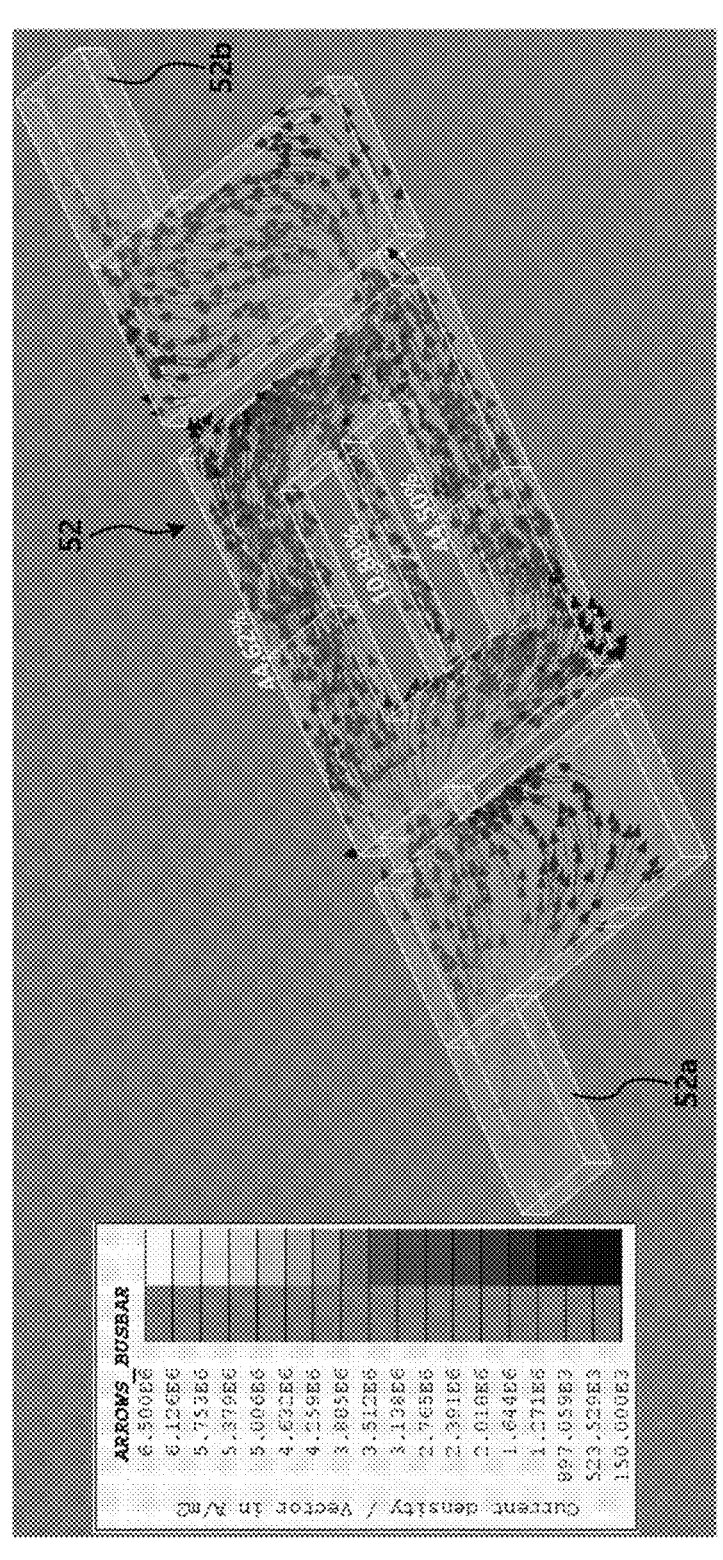

FIGS. 9 to 11 each show results of simulations for currents flowing through the metal bar, to which bottleneck parts (notches) are applied but locations of the bottleneck parts are upward rather than at a center. In addition, FIGS. 12 to 14 each show the results of simulations for currents flowing through the metal bar to which the bottleneck parts (notches) are applied, wherein a first bottleneck part is at an upper side, and a second bottleneck part is at a lower side.

When both bottleneck parts are at the top, the currents flowing in the center branches are 10.82%, 10.85%, and 10.84% depending on the location of the connecting spots, showing a maximum deviation of 0.03%. Also, when the first bottleneck is at the top and the second bottleneck is at the bottom, the currents flowing in the center branches are 10.87%, 10.89%, and 10.88% depending on the location of the connecting regions, showing a maximum deviation of 0.02%.

When the bottleneck parts are located at the center, as shown in FIGS. 6 to 8, even when the locations of the connecting regions change, the currents of the center branches are 12.78%, 12.78%, and 12.78%, which have the same current value up to 2 decimal places. However, when the bottleneck parts are not at the center, it may be noticed that there is a slight deviation at 2 decimal places. As above, it may be confirmed that the structure with the highest precision has both the bottleneck parts and the center branch that are located at the center of the widthwise direction.

In the metal bar 10 of the current measuring device according to the embodiment of the present disclosure, the first bottleneck part 12, the center branch 11c, and the second bottleneck part 14 are disposed on a straight line along the longitudinal direction and located at the center of the width-wise direction, thereby allowing a constant ratio of the current to flow through the center branch regardless of the connecting point (connecting spot) with the outside. Accordingly, there is an effect of enabling high-precision measurement.

Figure 15:
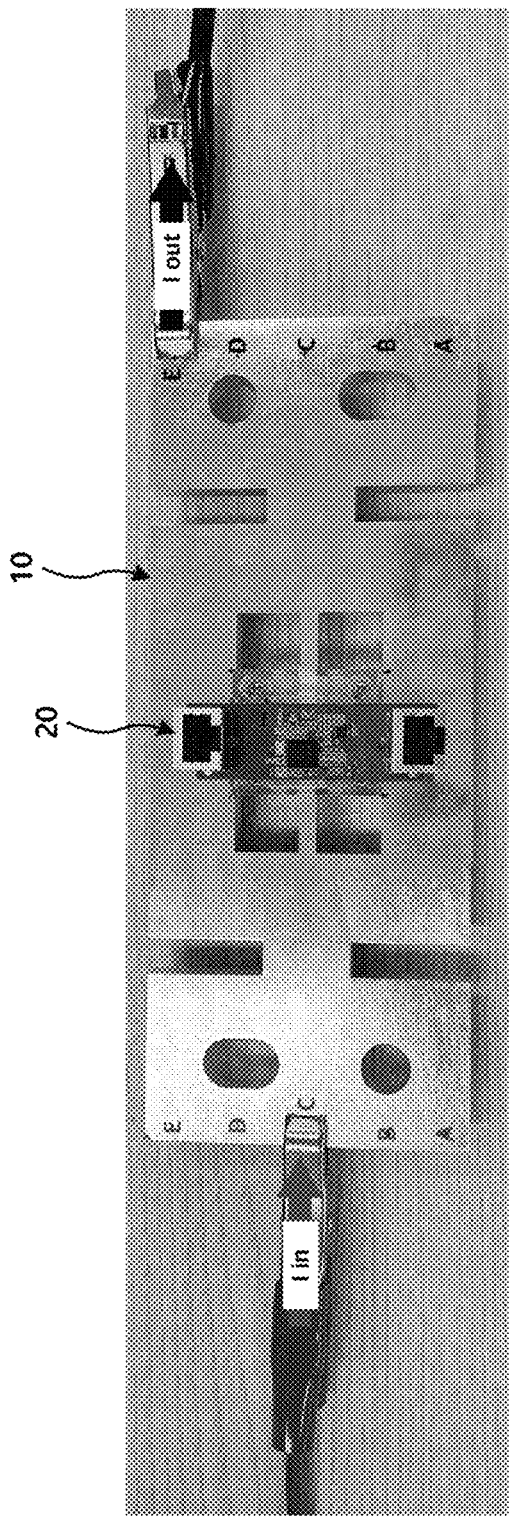
FIG. 15 is a photograph that captures a prototype of a metal bar and a current sensor module produced for an experiment.
Figures 16A, 16B:
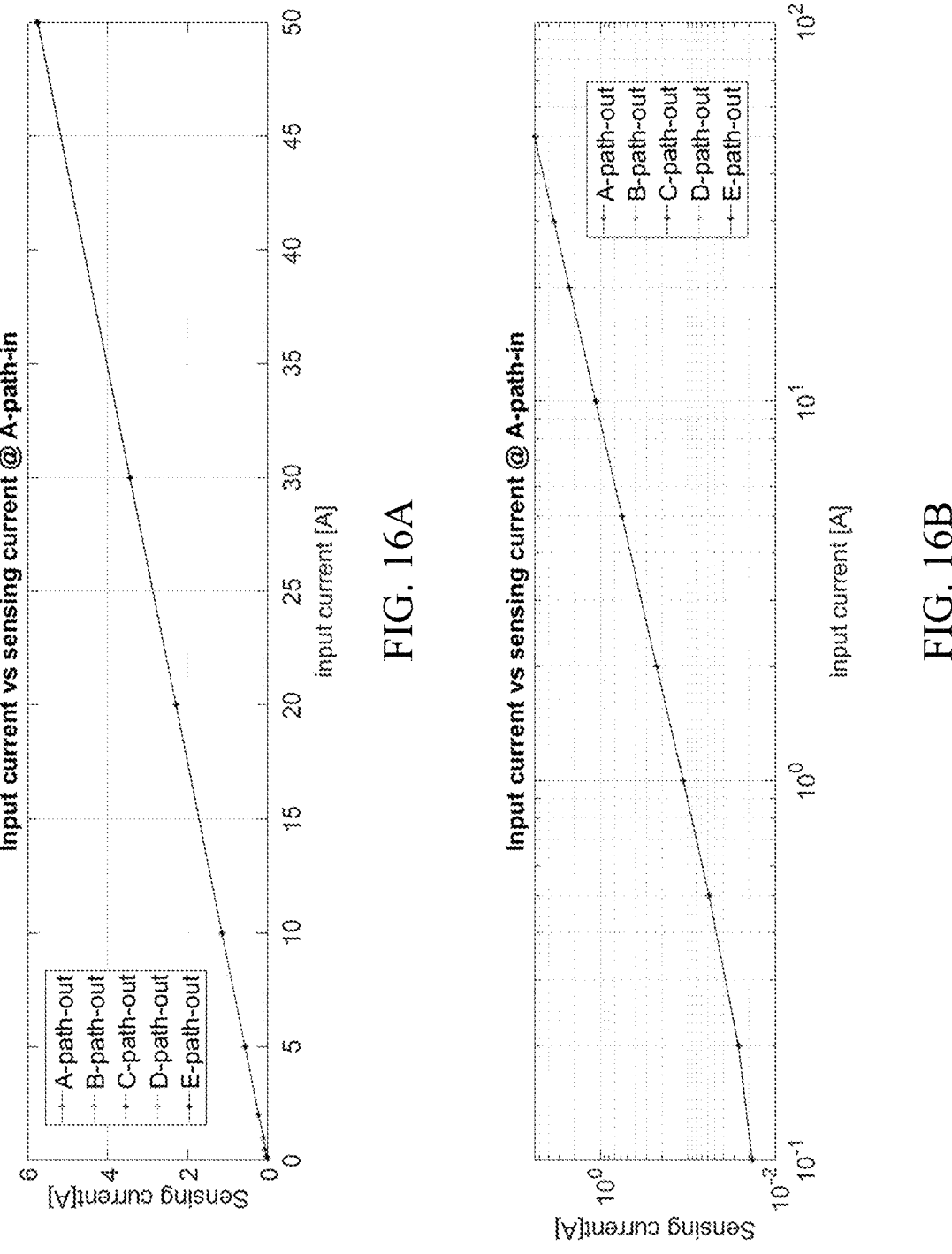

FIG. 15 is a photograph that captures a prototype of a metal bar and a current sensor module produced for an experiment, and FIG. 16A and FIG. 16B are graphs each differently showing results of measuring current while varying the connecting points (connecting spots) with the outside using the prototype of FIG. 15, wherein FIG. 16A is a graph shown on a linear scale and FIG. 16B is a graph shown on a logarithmic scale.

The experiment is performed while changing the locations of the connecting points (connecting spots) in the input side and output side to five types: A, B, C, D, and E In the experiment. Meanwhile, the graphs of FIG. 16A and FIG. 16B show the results of the experiment performed while changing the locations of the connecting spots in the output side to 5 types of A, B, C, D, and E.

In the graph, the horizontal axis represents the input current, while the vertical axis represents the sensing current. The ratio of the sensing current to the input current remains nearly constant regardless of the connecting spots. Therefore, it may be observed that the five lines overlap, creating the appearance of a single line.

Meanwhile, the current measuring device of the present disclosure calculates the entire current flowing in the metal bar 10 from the partial current flowing in the center branch 11c, and a calculation unit for such a calculation (conversion) may be constituted inside or outside the current sensor module.

The calculation unit is provided with a calibration table that stores a one-to-one correspondence between the partial current and the entire current, the entire current is calculated from the partial current sensed by the current sensor module 20 using the calibration table, and the calibration table is calibrated in the process of the production of each current measuring device.

The present disclosure provides a structure, in which side branches, each having a large sectional area, and a center branch having a small sectional area are provided so that the distributed current flows. Current sensing is performed only in the center branch having the small sectional area, and the entire current is measured by applying a predefined magnification.

According to the present disclosure, it is possible to measure high currents with small current sensing even while ensuring the precision of current measurement, thereby simultaneously solving problems of precision and size, and problems of price and the like, which are the difficulties in measuring large currents mentioned above. In addition, when continuous current passes, the temperature of the metal bar increases. However, the resistance coefficient of each of the branches, which are integrally provided, is the same, so it prevents the measurement accuracy from deteriorating due to temperature changes. In addition, the present disclosure is a method for measuring high currents and may be applied to both AC/DC measurements.

The invention claimed is:

1. A current measuring device for measuring an entire current flowing through a metal bar (10), using the metal bar (10) and a current sensor module (20) coupled thereto, wherein the metal bar (10) comprises:

a branch set (11) in which a plurality of branches, through which the entire current is divided and flows, is disposed adjacent to each other, wherein the current sensor module (20) is mounted on a center branch (11c) in a center among the plurality of branches included in the branch set (11), and the entire current is calculated from a partial current sensed by the current sensor module (20);

wherein the metal bar (10) comprises:

a first connecting part (13) constituted at one end of the metal bar (10) for a connection to an outside;

a first bottleneck part (12), which is constituted between the first connecting part (13) and the branch set (11) and through which the entire current flows in a concentrated manner before being distributed to the plurality of branches;

a second connecting part (15) constituted at an opposite end of the metal bar (10) for a connection to the outside; and a second bottleneck part (14), which is constituted between the branch set (11) and the second connecting part (15) and through which the entire current, which has been distributed to flow through the plurality of branches, flows in a concentrated manner, wherein the branch set (11), the first connecting part (13), the first bottleneck part (12), the second connecting part (15), and the second bottleneck part (14) all have a same thickness (t) and are located on a same plane, and wherein a width of each of the first bottleneck part (12) and the second bottleneck part (14) is no greater than ½ of a width that sums widths (w1,w2,w3) of all branches included in the branch set (11).

2. The current measuring device of claim 1, wherein the branch set (11) comprises:

the center branch (11c);

a first side branch (11s-1) located adjacent to one side of the center branch (11c) and having a gap width (s1) spaced apart from the center branch (11c); and a second side branch (11s-2) located adjacent to an opposite side of the center branch (11c) and having a gap width (s2) spaced apart from the center branch (11c), wherein a width (w2) of the first side branch (11s-1) and a width (w3) of the second side branch (11s-2) are the same.

3. The current measuring device of claim 2, wherein the center branch (11c), the first side branch (11s-1), and the second side branch (11s-2) all have a same thickness (t) and are located on a same plane.

4. The current measuring device of claim 1, wherein the metal bar (10) comprises:

bottleneck parts (12,14), which are each constituted between one of connecting points with the outsides and the branch set (11) and through which the entire current flows.

5. The current measuring device of claim 1, wherein the first bottleneck part (12), the center branch (11c), and the second bottleneck part (14) are disposed on a straight line along a longitudinal direction and located at a center in a widthwise direction, of the metal bar (10).

6. The current measuring device of claim 1, wherein the current sensor module comprises:

a Current Transformer (CT) or a core that surrounds the center branch (11c) and a Hall sensor.

7. A current measuring device for measuring an entire current flowing through a metal bar (10), using the metal bar

(10) and a current sensor module (20) coupled thereto, wherein the metal bar (10) comprises:

an even number of split slits (11a, 11b) disposed in a widthwise direction so that a branch set (11) including branches, provided in odd numbers of no smaller than 3, through which the entire current is divided and flows, is provided in a center of a longitudinal direction;

a 1-1 notch (12a) and a 1-2 notch (12b) provided at front ends of the split slits (11a,11b), respectively; and a 2-1 notch (14a) and a 2-2 notch (14b) provided at rear ends of the split slits (11a,11b), respectively;

wherein the metal bar (10) is a rectangle and has a plate-shaped outline, each of the 1-1 notch (12a) and the 2-1 notch (14a) is concaved inward from a corresponding longer side on one side of the rectangle, and each of the 1-2 notch (12b) and the 2-2 notch (14b) is concaved inward from a corresponding longer side on an opposite side of the rectangle, wherein an even number of split slits (11a, 11b) is symmetrical with respect to both the longitudinal and widthwise directions, the current sensor module (20) is mounted on a center branch (11c) located in a center among the branches included in the branch set (11), and the entire current is calculated from a partial current sensed by the current sensor module (20), and wherein current measuring device further comprises:

a calibration unit that is provided with a calibration table configured to store a one-to-one correspondence between the partial current and the entire current and is configured to calculate the entire current from the partial current sensed by the current sensor module (20) using the calibration table, wherein the calibration table is calibrated in a process of a production of each current measuring device.

8. The current measuring device of claim 7, wherein lengths (n1,n2,n3,n4) of the 1-1 notch (12a), the 1-2 notch (12b), the 2-1 notch (14a), and the 2-2 notch (14b), which are each concaved inward from a corresponding longer side of the rectangle, are all the same.

9. The current measuring device of claim 7, wherein one end of the metal bar (10) is provided with a first fastening hole (13a) for fastening a bolt when connected to an outside, and an opposite end of the metal bar (10) is provided with a second fastening hole (15a) for fastening a bolt when connected to the outside.

10. The current measuring device of claim 7, wherein the current sensor module comprises:

a Current Transformer (CT) or a core that surrounds the center branch (11c) and a Hall sensor.

11. A current measuring device for measuring an entire current flowing through a metal bar (10), using the metal bar (10) and a current sensor module (20) coupled thereto, wherein the metal bar (10) comprises:

a branch set (11) in which a plurality of branches, through which the entire current is divided and flows, is disposed adjacent to each other, and wherein the current sensor module (20) is mounted on a center branch (11c) in a center among the plurality of branches included in the branch set (11), and the entire current is calculated from a partial current sensed by the current sensor module (20), and wherein the current measuring device further comprises a calibration unit that is provided with a calibration table configured to store a one-to-one correspondence between the partial current and the entire current and is configured to calculate the entire current from the partial current sensed by the current sensor module (20) using the calibration table, wherein the calibration table is calibrated in a process of a production of each current measuring device.

* * * * *